(12) United States Patent
Kim et al.

(10) Patent No.: US 7,548,569 B2
(45) Date of Patent: Jun. 16, 2009

(54) HIGH-POWER OPTICALLY END-PUMPED EXTERNAL-CAVITY SEMICONDUCTOR LASER

(75) Inventors: Gi-bum Kim, Yongin-si (KR);
Soo-haeng Cho, Yongin-si (KR); Taek Kim, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/525,093

(22) Filed: Sep. 22, 2006

(65) Prior Publication Data

US 2007/0263686 A1   Nov. 15, 2007

(30) Foreign Application Priority Data

May 12, 2006   (KR) .................... 10-2006-0042831

(51) Int. Cl.
*H01S 3/04* (2006.01)
*H01S 3/08* (2006.01)
*H01S 3/00* (2006.01)

(52) U.S. Cl. .................... 372/36; 372/34; 372/98; 372/99; 372/101; 372/109

(58) Field of Classification Search .................. 372/34, 372/36, 98, 99, 101, 109
See application file for complete search history.

(56) References Cited

U.S. PATENT DOCUMENTS

| | | | |
|---|---|---|---|
| 5,461,637 A | 10/1995 | Mooradian et al. | 372/92 |
| 6,101,201 A | 8/2000 | Hargis et al. | 372/36 |

*Primary Examiner*—Kenneth A Parker
*Assistant Examiner*—Hrayr A. Sayadian
(74) *Attorney, Agent, or Firm*—Buchanan Ingersoll & Rooney PC

(57) ABSTRACT

A high-power optically end-pumped external-cavity semiconductor laser is provided having a laser chip including an active layer and a distributed Bragg reflector (DBR) for emitting light of a fundamental wavelength; an external mirror spaced apart from a first surface of the laser chip and forming a cavity resonator with the DBR; a second harmonic generation (SHG) crystal positioned between the external mirror and the laser chip; and a micro-lens integrated heat sink dissipating heat generated by the laser chip and bonded to a second surface of the laser chip to focus a pumping beam to be incident on the second surface of the laser chip.

20 Claims, 2 Drawing Sheets

HIGH-POWER OPTICALLY END-PUMPED EXTERNAL-CAVITY SEMICONDUCTOR LASER

CROSS-REFERENCE TO RELATED PATENT APPLICATION

This application claims the benefit of Korean Patent Application No. 10-2006-0042831, filed on May 12, 2006, in the Korean Intellectual Property Office, the disclosure of which is incorporated herein in its entirety by reference.

BACKGROUND OF THE DISCLOSURE

1. Field of the Disclosure

The present disclosure relates to a semiconductor laser, and more particularly, to a high-power optically end-pumped external-cavity semiconductor laser capable of allowing a pumping laser beam to be directly incident from a rear of a laser chip through a micro-lens integrated heat sink.

2. Description of the Related Art

Vertical cavity surface emitting lasers (VCSELs) employ single longitudinal oscillations of very narrow spectrums of light to emit beams having small projection angles. Thus, the coupling efficiency of VCSELs with optical fibers is high and VCSELs can be easily integrated with other devices when forming the surface emitting structures thereof. As a result, VCSELs are suitable as light sources of displays.

However, VCSELs commonly must have oscillation areas of 10 μm or less to make possible single longitudinal operations. However, even in this instance, VCSELs are changed from having single longitudinal states of light into having multiple longitudinal states of light as the result of the thermal lensing effects caused by increases in optical power. Thus, the maximum power of VCSELs in the single longitudinal state commonly does not exceed 5 mW.

Vertical external-cavity surface emitting lasers (VECSELs) have been suggested as a solution which could retain the advantages of VCSELs and make possible high power operations. In VECSELs upper distributed Bragg reflectors (DBRs) can be replaced with external mirrors to increase the gain areas so as to obtain a power of 100 mW or more. Surface emitting lasers have smaller gain volumes than edge emitting lasers and thus it is difficult to obtain sufficiently high gains in such surface emitting lasers. In order to address this disadvantage, VECSELs having periodic gain structures in which quantum wells (QWs) are arranged periodically have been developed. Also, there are limitations in uniformly injecting carriers into large areas using electric pumping. Thus, VECSELs having structures which uniformly pump over wide areas by optical pumping have been developed so as to obtain high powers.

A conventional VECSEL includes a pumping unit supplying a pumping laser beam, a laser chip pumped by the pumping laser beam in order to emit a laser beam, and an external mirror installed outside the laser chip constituting an external cavity resonator.

The pumping unit includes a pumping light source and a collimating lens condensing the pumping laser beam radiated from the pumping light source.

However, in the structure of the pumping unit, the distance from the pumping light source to the laser chip is half of an entire length of the VECSEL. Thus, there are limitations when attempting to reduce the size of a VECSEL module. Accordingly, it is difficult to modularize the VECSEL to a compact size of several to tens of millimeters.

SUMMARY OF THE DISCLOSURE

The present invention may provide a high-power optically end-pumped external-cavity semiconductor laser which can be mass-produced having a compact size while using a simple fabricating process.

The present invention also may provide a high-power optically end-pumped external-cavity semiconductor laser allowing a pumping laser beam to be vertically incident on a laser chip without using a collimating lens focusing the pumping laser beam so as to prevent reflection loss from occurring and to improve the pumping efficiency.

According to an embodiment of the present invention, there may be provided a high-power optically end-pumped external-cavity semiconductor laser including: a laser chip comprising an active layer and a distributed Bragg reflector (DBR) for emitting light of a fundamental wavelength; an external mirror spaced apart from a first surface of the laser chip and forming a cavity resonator with the DBR; a second harmonic generation (SHG) crystal positioned between the external mirror and the laser chip; and a micro-lens integrated heat sink dissipating heat generated by the laser chip and bonded to a second surface of the laser chip to focus a pumping laser beam to be incident on the second surface of the laser chip.

The high-power optically end-pumped external-cavity semiconductor laser may further include a pump laser arranged in line with the external mirror, the SHG crystal, the laser chip, and the micro-lens integrated heat sink and allowing a pumping beam to be incident on the DBR of the laser chip through a micro-lens.

The active layer may include: a plurality of quantum wells (QWs) formed to emit a predetermined fundamental wavelength; and gain layers provided on and underneath the QWs for absorbing the pumping beam.

BRIEF DESCRIPTION OF THE DRAWINGS

The above and other features and advantages of the present invention are illustrated in detailed exemplary embodiments thereof with reference to the attached drawings in which.

DETAILED DESCRIPTION OF EXEMPLARY EMBODIMENTS

Figure 1:
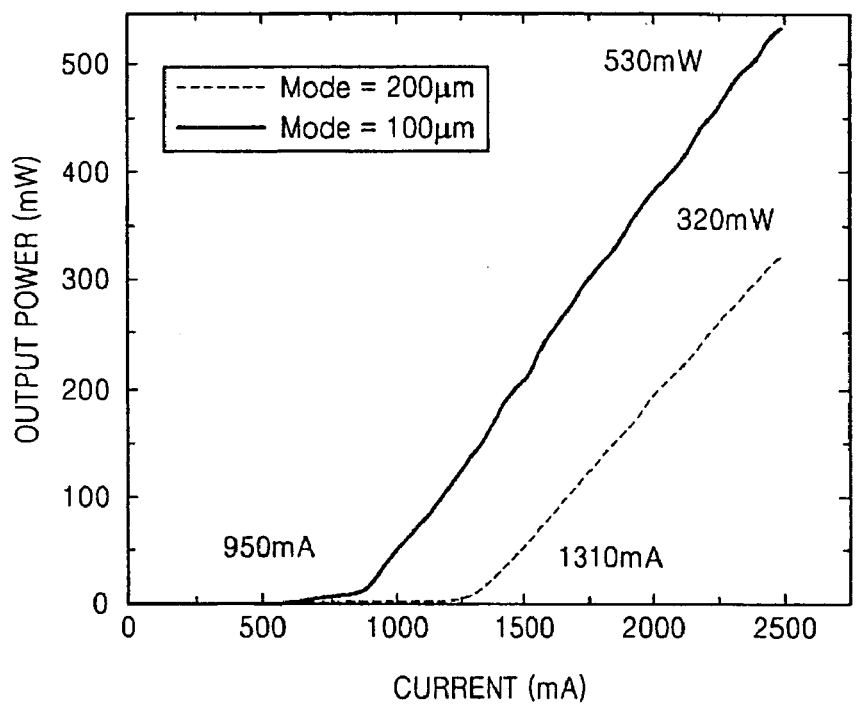
FIG. 1 is a graph illustrating the relationship between an output power and a threshold current of a high-power optically end-pumped external-cavity semiconductor laser using two different mode sizes of an optical pumping laser beam.

FIG. 1 is a graph illustrating a relationship between output power and threshold current of a high-power optically end-pumped external-cavity semiconductor laser using two different mode sizes of an optical pumping beam. Referring to FIG. 1, when a pumping beam having a mode size of 200 μm is directly incident on a laser chip without using a collimating lens as represented by the dotted line on the graph of FIG. 1, a threshold current is higher and an output power is lower than when a collimating lens is used as represented by the solid line. When a pumping beam having a mode size of 100 μm is focused by a collimating lens to be incident on the laser chip, the threshold current is about 950 mA, and the maximum output power is about 530 mW at an injection current of about 2500 mA. However, when the pumping beam is not focused by a collimating lens, the threshold current is increased to about 1310 mA, and the maximum output power is decreased to about 320 mW at the injection current of about 2500 mA. The threshold current and the output power of the high-power optically end-pumped external-cavity semiconductor laser depend on the mode size of the pumping beam due to the matching conditions of the mode size of the pumping beam and the mode size of the fundamental laser beam emitted from the laser chip. Therefore, there is required a laser structure capable of allowing a pumping beam to directly contact a laser chip and to obtain a stable laser resonance mode so as to fabricate a compact external-cavity laser module and obtain maximum output power.

Figure 2:
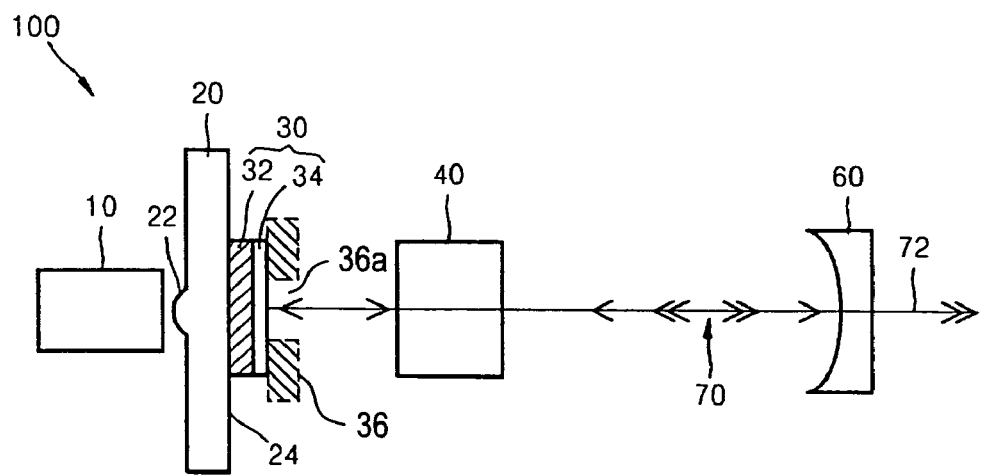
FIG. 2 is a cross-sectional view of a high-power optically end-pumped external-cavity semiconductor laser according to an embodiment of the present invention.

FIG. 2 is a cross-sectional view of a high-power optically end-pumped external-cavity semiconductor laser according to an embodiment of the present invention. Referring to FIG. 2, a high-power optically end-pumped external-cavity semiconductor laser 100 is an optically end-pumped type VECSEL and includes a micro-lens integrated heat sink 20, a laser chip 30, a second harmonic generation (SHG) crystal 40, and an external mirror 60 that are sequentially arranged in line in the direction in which a pumping laser beam is incident.

The micro-lens integrated heat sink 20 transmits a pumping beam of a predetermined wavelength, e.g., a wavelength of 808 nm, radiated from a pump laser 10 and externally dissipates heat generated by the laser chip 30. The micro-lens integrated heat sink 20 may be formed of a material having a high thermal expansion efficiency and which is optically transparent with respect to the pumping beam. Examples of such materials are diamond, silicon carbide (SiC), sapphire, aluminum nitride (AlN), and gallium nitride (GaN).

A micro-lens 22 of the micro-lens integrated heat sink 20 may have a semi-spherical shape, an ellipsoidal shape, or an asymmetric shape to focus the pumping beam so as to match a mode size of the pumping beam with a mode size of a fundamental laser beam formed of light emitted by the laser chip 30.

Figure 4:
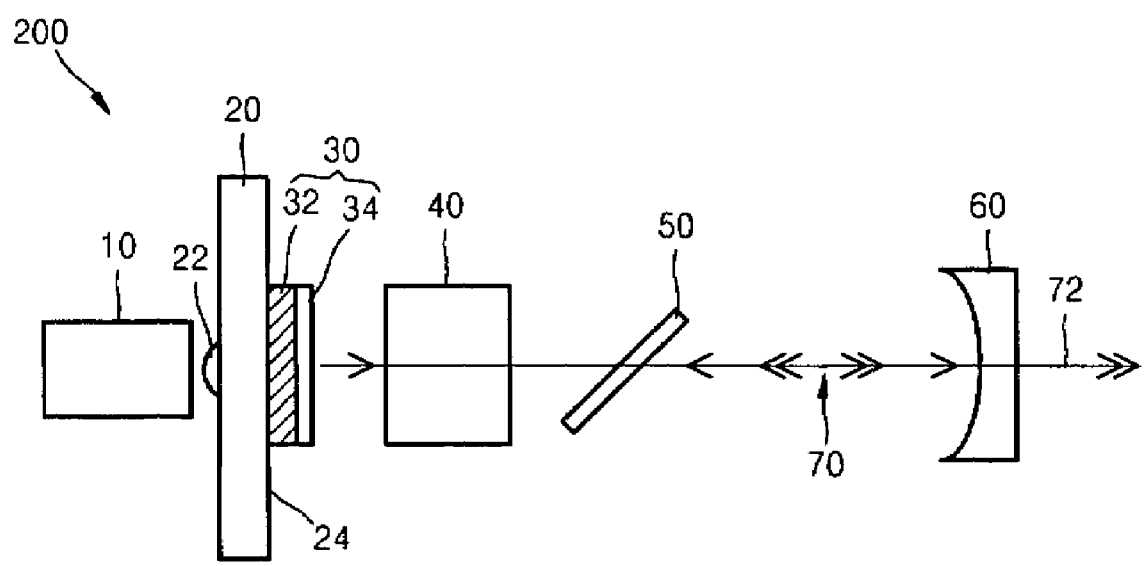
FIG. 4 is a cross-sectional view of a high-power optically end-pumped external-cavity semiconductor laser according to a further embodiment of the present invention.

The micro lens 22 and a heat sink may be formed of heterogeneous materials and which are incorporated into the micro-lens integrated heat sink 20 (See FIG. 4). If the micro-lens 22 and the heat sink are formed of the heterogeneous materials, the micro-lens 22 and the heat sink may be combined for example by using capillary bonding or fusion bonding. In this instance, the micro-lens 22 may be formed of glass, quartz, silicon carbide (SiC), aluminum nitride (AlN), or gallium nitride (GaN). An anti-reflective coating is formed on a surface of the micro-lens 22 to minimize reflection of the pumping laser beam.

The laser chip 30 includes an active layer 34 and a distributed Bragg reflector (DBR) 32. The active layer 34 has a resonate periodic gain (RPG) structure including a plurality of quantum well (QW) layers having a composition for emitting a predetermined fundamental wavelength and gain layers formed on and underneath the QW layers for absorbing the pumping laser beam.

For example, the QW layers may be formed of a semiconductor material, such as $In_xGa_{1-x}As_yP_{1-y}$, $In_xGa_{1-x}As$, $In_xGa_{1-x}N_yAs_{1-y}$, or $In_xGa_{1-x}As_ySb$. Here, $0.0 \leq x < 1.0$ and $0.0 < y < 1.0$ apply. The gain layers include at least one of the $Al_xGa_{(1-x)}As$ ($0 \leq x \leq 0.3$) layers and $GaAs_{(1-y)}P_y$ ($0 \leq y \leq 0.3$) layers.

Light having the fundamental wavelength generated by the laser chip 30 having the above-described structure has a wavelength between about 350 nm and about 1550 nm.

The DBR 32 is a high reflectance mirror reflecting the light having the fundamental wavelength emitted from the active layer 34 toward the external mirror 60 so as to resonate a laser beam in the cavity resonator 70 between the DBR 32 and the external mirror 60. For example, the DBR 32 may be formed by alternately stacking layers formed of $Al_xGa_{(1-x)}As$ ($0.5 \leq x \leq 1$) and $Al_xGa_{(1-x)}As$ ($0 \leq x \leq 0.5$).

The SHG crystal 40 is positioned between the laser chip 30 and the external mirror 60 and converts the laser beam having the fundamental wavelength radiated from the laser chip 30 into a laser beam having a second wavelength half the length of the fundamental wavelength. For example, if the fundamental wavelength is 1064 nm, the second wavelength is 532 nm. The SHG crystal 40 may be potassium titanyl phosphate (KTP), $LiNbO_3$, periodically poled $LiNbO_3$ (PPLN), KTN, $KnbO_3$, or the like. The SHG crystal 40 may be disposed so as to be adjacent to the laser chip 30.

When compared to a conventional VECSEL including a pump laser disposed in a sideways direction, in the high-power optically end-pumped external-cavity semiconductor laser according to the present embodiment having the above-described structure, a pump laser 10 is disposed in line with other elements at the rear of the laser chip 30 to be coaxial with the other elements, and a collimating lens is removed. Thus, the high-power optically end-pumped external-cavity semiconductor laser 100 of the present embodiment of the present invention can be mass-produced in a compact size while using a simpler fabricating process than conventional VECSELs. For example, the high-power optically end-pumped external-cavity semiconductor laser 100 may be fabricated to have a diameter of about 20 mm and a length of about 50 mm excluding the pump laser 10. Moreover, since the pumping beam can be directly incident on the laser chip 30, reflection loss is substantially eliminated, while the pumping beam can be focused on a necessary part. Thus, the output power of the high-power optically end-pumped external-cavity semiconductor laser 100 can be increased, and a cross-section of a laser beam emitted from the laser chip can be retained in a nearly circular configuration. Also, since the pump laser 10 is not disposed in a sideways direction, the SHG crystal 40 can be disposed near to the laser chip 30. Thus, the optical wavelength conversion efficiency of the SHG crystal 40 can be increased.

The laser chip 30 may be combined with a flat surface 24 of the micro-lens integrated heat sink 20 using capillary bonding or fusion bonding. In other words, the DBR and the micro-lens integrated heat sink are combined with each other using capillary bonding or fusion bonding. The DBR 32 of the laser chip 30 positioned in the opposite direction to the external mirror 60 in reference to the active layer 34 contacts the flat surface 24 of the micro-lens integrated heat sink 20 on which a micro-lens is not formed.

The laser chip 30 may further include a substrate 36 formed on the active layer 34. In this instance, an opening 36a may be formed in a center of the substrate so as to allow the fundamental laser beam to pass toward the cavity resonator 70 without loss.

Figure 3:
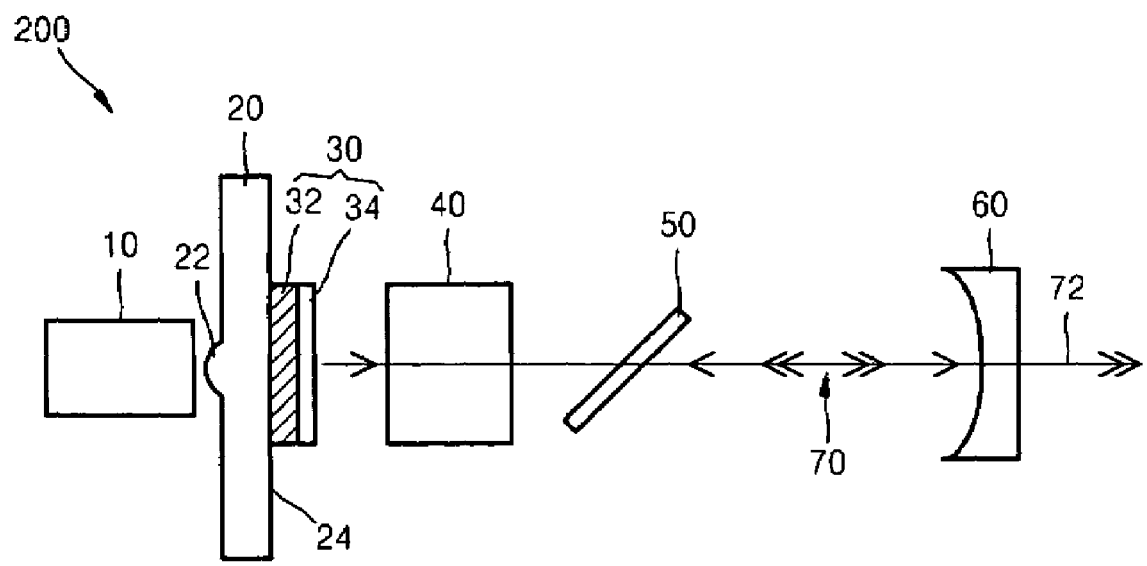
FIG. 3 is a cross-sectional view of a high-power optically end-pumped external-cavity semiconductor laser according to another embodiment of the present invention.

FIG. 3 is a cross-sectional view of a high-power optically end-pumped external-cavity semiconductor laser according to another embodiment of the present invention. Referring to FIG. 3, a high-power optically end-pumped external-cavity semiconductor laser 200 is an optically end-pumped VECSEL and includes a micro-lens integrated heat sink 20, a laser chip 30, a SHG crystal 40, a birefringent filter 50, and an external mirror 60 that are sequentially arranged in line in a direction in which a pumping laser beam is incident.

The birefringent filter 50 is positioned on an optical path between the laser chip 30 and the external mirror 60 so as to pass only a laser beam having a specific wavelength.

An operation of the high-power optically end-pumped external-cavity semiconductor laser 200 having the above-described structure will hereafter be described. A laser beam emitted from a pump laser 10 is incident on the laser chip 30 through the micro-lens integrated heat sink 20. The laser beam emitted from the pump laser 10 is focused by a micro-lens 22. The focused laser beam is incident on the laser chip 30 through DBR 32. An active layer 34 of the laser chip 30 is excited so as to generate light. The light generated by the laser chip 30 is reflected by the DBR 32 of the laser chip 30 and is thereafter incident on the SHG crystal 40. The SHG crystal 40 converts some of the incident light into light having a frequency double that of the incident light, i.e., light having a wavelength ½ that of the incident light. The light having the converted frequency and the remainder of the fundamental light generated by the laser chip 30 pass through the birefringent filter 50. Only light of a narrow range of wavelengths can pass through the birefringent filter 50 and thus a spectrum distribution of the light that has passed through the birefringent filter 50 has very sharp peaks. Only the light having wavelengths corresponding to the very sharp peaks are resonated in the cavity resonator 70 until gains suitable for output are obtained. For example, if an incident light is of an infrared wavelength, the light having been converted by the SHG crystal 40 and passing through the birefringent filter 50 possesses a laser beam having a very narrow range of visible wavelengths. The external mirror 60 transmits and outputs a laser beam having the converted wavelength and reflects the light having the non-converted wavelength toward the SHG crystal 40. The wavelength of some of the reflected light is converted by the SHG crystal 40. The light having the non-converted wavelength is incident on the laser chip 30. A portion of the light incident on the laser chip 30 is absorbed by the active layer 34 of the laser chip 30, and a portion of the light is reflected by the DBR 32 of the laser chip 30 and repeatedly undergoes the above-described processes. As a result, the light having the non-converted wavelength is resonated in a cavity resonator 70 between the laser chip 30 and the external mirror 60.

As shown in FIG. 3, the birefringent filter 50 is disposed on an optical path between the SHG crystal 40 and the external mirror 60. However, the birefringent filter 50 may be positioned on an optical path between the laser chip 30 and the SHG crystal 40 and pass only light of a very narrow range of wavelengths.

As the micro-lens integrated heat sink 20 shown in FIG. 2, the micro-lens integrated heat sink 20 shown in FIG. 3 transmits a laser beam having a predetermined wavelength, e.g., a wavelength of about 808 nm radiated from the pump laser 10 and externally dissipates heat generated by the laser chip 30. The micro-lens 22 of the micro-lens integrated heat sink 20 may have for example a semi-spherical shape, an ellipsoidal shape, or an asymmetric shape to focus the pumping laser beam so as to match a mode size of the pumping beam with a mode size of a fundamental laser beam emitted from the laser chip 30.

The micro-lens 22 and a heat sink may be formed of heterogeneous materials and then integrated to form the micro-lens integrated heat sink 20 (See FIG. 4). If the micro-lens 22 and the heat sink are formed of the heterogeneous materials, the micro-lens 22 and the heat sink may be combined with each other for example by using capillary bonding or fusion bonding. In this case, the micro-lens 22 may be formed of glass, quartz, silicon carbide (SiC), aluminum nitride (AlN), or gallium nitride (GaN). An antireflective coating may be formed on a surface of the micro-lens 22 to minimize reflection the pumping laser beam.

As described above, a high-power optically end-pumped external-cavity semiconductor laser according to the present invention can be fabricated as a compact module using a micro-lens integrated heat sink. Thus, incidence loss of a pumping laser beam can be reduced, and the efficiency of the pumping laser beam as an excitation laser beam is not substantially deteriorated.

Also, a pump laser can be arranged in line with other elements of the semiconductor laser at the rear of a laser chip, and a collimating lens can be removed. Thus, the process for fabricating the high-power optically end-pumped external-cavity semiconductor laser can be simplified, and thus the high-power optically end-pumped external-cavity semiconductor laser can be mass-produced. Also, the overall size of the high-power optically end-pumped external-cavity semiconductor laser can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high-power optically end-pumped external-cavity semiconductor laser comprising:
   a laser chip comprising an active layer and a distributed Bragg reflector (DBR) for emitting light of a fundamental wavelength;
   an external mirror spaced apart from a first surface of the laser chip and forming a cavity resonator with the DBR;
   a second harmonic generation (SHG) crystal positioned between the external mirror and the laser chip; and
   a micro-lens integrated heat sink dissipating heat generated by the laser chip and bonded to a second surface of the laser chip to focus a pumping beam to be incident on the second surface of the laser chip.

2. The high-power optically end-pumped external-cavity semiconductor laser of claim 1, further comprising a pump laser arranged in line with the external mirror, the SHG crystal, the laser chip, and the micro-lens integrated heat sink and allowing a laser beam to be incident on the DBR of the laser chip through a micro-lens.

3. The high-power optically end-pumped external-cavity semiconductor laser of claim 1, wherein a micro-lens of the micro-lens integrated heat sink has a semi-spherical shape, an ellipsoidal shape, or an asymmetric shape so as to focus the pumping beam so as to match a mode size of the focused pumping beam with a mode size of a reference laser beam formed of light emitted from the laser chip.

4. The high-power optically end-pumped external-cavity semiconductor laser of claim 1, wherein the micro-lens integrated heat sink is formed of a material suitable for transmitting the pumping laser beam.

5. The high-power optically end-pumped external-cavity semiconductor laser of claim 4, wherein the material suitable for transmitting the pumping laser beam is selected from the group consisting of diamond, silicon carbide (SiC), aluminum nitride (AlN), and gallium nitride (GaN).

6. The high-power optically end-pumped external-cavity semiconductor laser of claim 1, wherein a micro-lens and a heat sink are formed of heterogeneous materials and are integrated to form the micro-lens integrated heat sink.

7. The high-power optically end-pumped external-cavity semiconductor laser of claim 6, wherein the micro-lens and the heat sink are combined with each other while using capillary bonding or fusion bonding.

8. The high-power optically end-pumped external-cavity semiconductor laser of claim 6, wherein the micro-lens is selected from the group consisting of glass, quartz, silicon carbide (SiC), aluminum nitride (AlN), and gallium nitride (GaN).

9. The high-power optically end-pumped external-cavity semiconductor laser of claim 1, wherein an anti-reflective coating is formed on a surface of the micro-lens.

10. The high-power optically end-pumped external-cavity semiconductor laser of claim 1, wherein the active layer comprises:
    a plurality of quantum wells (QWs) formed to emit a predetermined fundamental wavelength; and
    gain layers provided on and underneath the QWs for absorbing the pumping beam.

11. The high-power optically end-pumped external-cavity semiconductor laser of claim 10, wherein the QWs comprise at least one semiconductor material of $In_xGa_{1-x}As_yP_{1-y}$, $In_xGa_{1-x}N_yAs_{1-y}$, and $In_xGa_{1-x}As_ySb$, wherein $0.0=x<1.0$ and $0.0<y<1.0$.

12. The high-power optically end-pumped external-cavity semiconductor laser of claim 10, wherein the gain layers comprise at least one of a $AlxGa_{(1-x)}As$ ($0 \leq x \leq 0.3$) layer and a $GaAs_{(1-y)}P_y$ ($0 \leq y \leq 0.3$) layer.

13. The high-power optically end-pumped external-cavity semiconductor laser of claim 1, wherein the fundamental wavelength is between about 350 nm and 1550 nm.

14. The high-power optically end-pumped external-cavity semiconductor laser of claim 1, wherein the DBR is formed by alternately stacking layers formed of $Al_xGa_{(1-x)}As$ ($0.5 \leq x \leq 1$) and layers formed of $Al_xGa_{(1-x)}As$ ($0 \leq x \leq 0.5$).

15. The high-power optically end-pumped external-cavity semiconductor laser of claim 1, wherein a birefringent filter is positioned between the external mirror and the SHG crystal.

16. The high-power optically end-pumped external-cavity semiconductor laser of claim 1, wherein a birefringent filter is positioned between the laser chip and the SHG crystal.

17. The high-power optically end-pumped external-cavity semiconductor laser of claim 1, wherein the laser chip further comprises a substrate disposed on the active layer and facing the external mirror.

18. The high-power optically end-pumped external-cavity semiconductor laser of claim 17, wherein an opening is located in a center of the substrate so that light of the fundamental wavelength generated by the laser chip advances without loss.

19. The high-power optically end-pumped external-cavity semiconductor laser of claim 1, wherein the DBR of the laser chip contacts a flat surface of the micro-lens integrated heat sink on which the micro-lens is not formed.

20. The high-power optically end-pumped external-cavity semiconductor laser of claim 19, wherein the DBR and the micro-lens integrated heat sink are combined with each other using capillary bonding or fusion bonding.

\* \* \* \* \*